United States Patent [19]

Bakker et al.

[11] Patent Number: 4,820,921
[45] Date of Patent: Apr. 11, 1989

[54] METHOD OF BEAM CENTERING

[75] Inventors: Johan G. Bakker, Eindhoven; Karel D. Van Der Mast, Pijnacker, both of Netherlands

[73] Assignee: U.S. Philips Corporation, New York, N.Y.

[21] Appl. No.: 85,992

[22] Filed: Aug. 14, 1987

[30] Foreign Application Priority Data

Aug. 27, 1986 [NL] Netherlands ............... 8602175

[51] Int. Cl.⁴ .......................................... H01J 37/147
[52] U.S. Cl. ..................................... 250/307; 250/311
[58] Field of Search ............... 250/307, 310, 311, 398

[56] References Cited

U.S. PATENT DOCUMENTS

| 4,095,104 | 6/1978 | LePoole et al. | 250/311 |
| 4,618,766 | 10/1986 | van der Mast et al. | 250/311 |
| 4,680,469 | 7/1987 | Nomura et al. | 250/311 |
| 4,698,503 | 10/1987 | Nomura et al. | 250/311 |

FOREIGN PATENT DOCUMENTS 60-91540 5/1985 Japan .

Primary Examiner—Carolyn E. Fields
Assistant Examiner—Jack I. Berman
Attorney, Agent, or Firm—Paul R. Miller

[57] ABSTRACT

By using, in beam path correction, a three-point adjustment of the beam wobbler, the beam path can be optimized for realizing minimum picture errors in the apparatus. For different lens energizations a picture-shifting correction can simply be carried out dynamically.

13 Claims, 1 Drawing Sheet

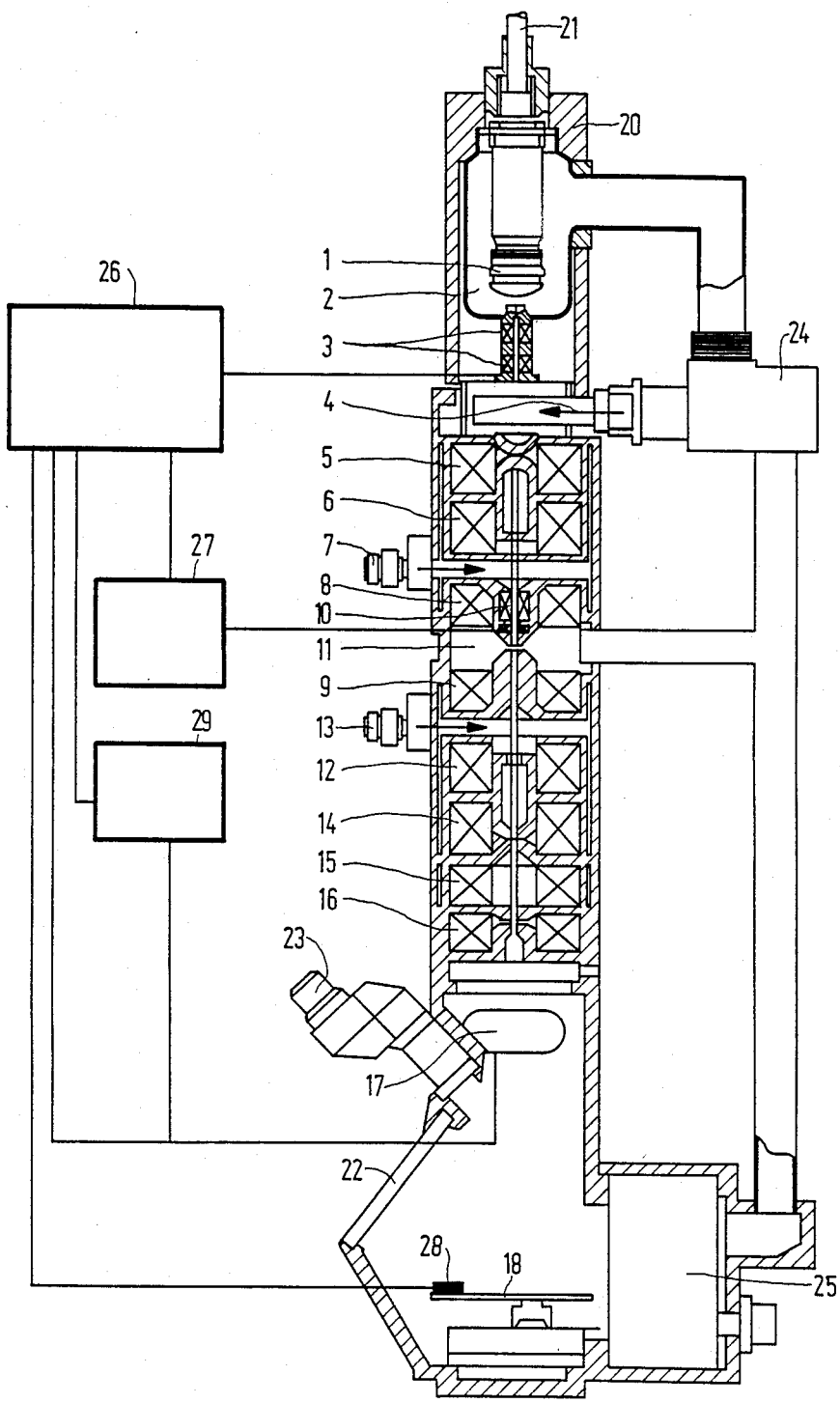

METHOD OF BEAM CENTERING

The invention relates to a method of centering a beam of charged particles in a charged particle beam apparatus having a particle source, a system of lenses, a wobbler, an objective lens and a central control device, and to an apparatus suitable for performing said method.

Such a method is known from an article in "Ultramicroscopy", No. 3, 1978, pp. 49–60 published by F. Zemlin, et al; hereinafter referred to as the Zemlin article. In this article a method of beam-centering is described in which a tableau of diffractograms of, for example, a carbon foil, is taken at a fixed tilt angle under various azimuths. With two azimuthally diametrically located beam runs with likewise equal tilt angle and evaluation of the series of diffractograms, centering criteria for the beam are then derived in an electron-microscope. Taking and in particular also evaluation of such a series of diffractograms is comparatively time-consuming and as a result of this makes this method already less suitable for general use. A more serious disadvantage is that also after performing the method, certainty is not obtained that the beam is indeed centered correctly. On the contrary, for high resolving power adjustments, intolerable deviations in centering will be possible. This is caused by the fact that locally, for example, on the display screen, the criteria for optimum centering may also be satisfied by compensation of a directional error by a spherical aberration error of a relevant lens. The criteria specified in the Zemlin article for optimum beam centering have then been satisfied only partly. The method described is also less suitable in particular due to the time-consuming character thereof for use for a dynamic beam centering.

It is the object of the invention to provide a more generally useful beam correction method which in all circumstances leads to a sufficiently exact centering. For this purpose, a method of the type mentioned in the opening paragraph is characterized according to the invention in that image displacements for two wobbler adjustments are determined with respect to a third wobbler adjustment situated symmetrically therebetween and the image displacements are then made mutually equal by readjusting the central composition exposure beam.

Since in the method according to the invention only image displacements need be compared, the beam correction in this case requires comparatively little time and since comparison is carried out with respect to a central position the centering due to the mutual equalization of the displacements, can be carried out so that optimum centering is ensured for the whole relevant beam run. By focusing, the images can be moved towards each other until an operative distance has been achieved which is attractive for the measurement.

The method is preferably carried out in two directions extending transversely to each other. The image displacements can be performed by any desired beam tilt frequency so that this can be selected so that the displacements can simply be determined. The procedure may both be carried out visually and may be automated by means of a method suitable for that purpose.

For automatic measurement of the beam displacement use can be made of either a single detector, a linear array of detectors or a linear place-sensitive detector, two linear detector arrays or linear place-sensitive detectors oriented transversely to each other, or a scanning detection system with a television circuit or a self-scanning matrix of, for example, CCD detector elements.

When according to the method the optimum exposure angle for the composition has been adjusted, it is desirable for the optical axis of the lens to be centered with respect to a subsequent lens system and the display screen so that upon variation of the energization of the lens the image rotates about the centered of the screen.

Dynamic centering is realized by determining, at different values of the energization of a relevant lens, for example the objective lens, the associated beam corrections and, for example, for an electron microscope operating in STEM mode, applying them to a beam deflection system in the apparatus and, for an electron microscope operating in TEM mode, applying them to a picture deflection device. The adjustment of these dynamic corrections can also be carried out automatically.

A few preferred embodiments according to the invention will now be described in greater detail hereinafter with reference to the accompanying drawing, in which the sale FIGURE shows an apparatus for use of the method in the form of an electron microscope.

An electron microscope as shown in the drawing comprises an electron source 1 having an anode 2, a beam tilt device or wobbler 3 and a diaphragm 4, a condensor system having in this case a first condensor lens 5, a second condensor lens 6 and a condensor diaphragm 7, an objective having in this case a first objective pole 8 in which an auxiliary lens 19 has been incorporated, and a second objective pole 9, a beam-scanning system 10, an objective space 11, a diffraction lens 12 having a diffraction diaphragm 13, an intermediate lens 14, a projection system having a first projection lens 15 and a second projection lens 16, a camera 17 and an inspection screen 18. All these components are incorporated in a lens 20 having an electric supply line 21 for the source and an inspection window 22. Situated on the housing are an optical eye piece 23, a vacuum pump 24 and a space 25, for example, for a plate camera or another detection device.

A central control device 26 is connected to at least the beam wobbler, an objective lens energization device 27, the camera 17 and a detection system 28 shown diagrammatically. After activating the apparatus, according to the invention, the three beam displays for three wobbler adjustments are projected on the screen or in the camera. In the case of manual operation these can be studied, for example, directly on the screen or on a monitor 28 fed by the camera 17. The images can be observed simultaneously by means of a wobbler adjusting frequency of at least a few Hz and, by readjusting the exposure direction of the beam, they can be oriented symmetrically with respect to the central image and then be moved towards each other by objective lens focusing. In essentially the same manner this treatment can be carried out automatically, in which the detector device has been constructed so that a signal is always obtained which is relevant for the image position on the screen or in the camera. Herefrom differential signals with respect to the central beam position can be derived which can be made equal mutually again by readjusting the direction of the exposure beam. The distance of the two displaced images with respect to the central image can be adjusted at a value which is most favourable for measurement and comparison, respectively, by means of the objective lens energization. For automatic measurements it may be favourable to operate with a linear array of detectors or a linear place-sensitive detector, as a result of which a measure of mutual beam displacement can be obtained directly. Such signal determination can even be refined by means of two orthogonal arrays of linear detectors or by means of a matrix of detector elements. Since beam displacements are measured with respect to a reference adjustment, which is the central wobbler adjustment, the beam variation through the relevant part of the apparatus is optimized for as low as possible picture defects which may arise, for example, by spherical aberration of the relevant lens, in this case the objective lens.

Because in the lenses most relevant for the image formation variation of the lens energization may result in a beam displacement which is not permissible for a sufficiently exact beam adjustment, the invention also provides a dynamic correction therefor. This correction can also be carried out automatically. A signal which is proportional to the energization is transmitted to the central control device from the energization device 27 for the objective lens. In this energization the beam displacements are determined and corrected and the energizations of the beam deflection device necessary therefor are related to the objective lens current.

The invention may be carried out by using the optical axis of the apparatus as the Z-axis, both for wobbler adjustments in the X-direction and for adjustments in the Y-direction, then image displacements are determined relative to a central exposure beam device in which adjustment is identical for both directions. Further, a wobbler adjustment frequency of between approximately 1 and 500 Hz is used.

The detectors may use a single detector for image displacement measurements, or a place-sensitive linear detector array may be used. A scanning detection system may be used having a television circuit between the detection system and the central control device 26. Also, a matrix of self-scanning CCD elements can be used. Optimum detection may be used for beam displacements by controlling energization of the objective lens.

For a STEM-mode adjustment of an apparatus using a beam of charged particles, a beam deflection signal which depends on the objective lens energization can be appled to a beam deflection device. For a TEM-mode adjustment of an apparatus using charged particles, the beam deflection signal which depends on the objective energization can be applied to a picture deflection device. Switching between the TEM and STEM modes is carried out by equipping the objective lens with a switchable auxiliary lens, and the central control device 26 which is controlled by a switching signal applies the beam deflection signals to the beam deflection device.

Although the beam centering described applies to all particle lenses of such apparatuses, the objective lens, in particular of, for example, electron microscopes, preferably is the subject of such correction. It is just the objective lens in this type of apparatus which is strongly image or spot-decisive and moreover the energization for such lens is very much varied. This applies to an equal extent to the objective lens, also termed terminal lens, of electron beam or ion beam writing apparatuses or inspection apparatuses operating with a beam of charged particles.

What is claimed is:

1. A method of centering a beam of charged particles in a charged particle beam apparatus comprising the steps of
   forming a beam of charged particles by using a particle source, a system of lenses, a wobbler, an objective lens system, and a central control device,
   determining image displacements for two different wobbler adjustments with respect to an image located between said displaced images and corresponding to a third wobbler adjustment, and then readjusting the beam to make said different image displacements equal.

2. A method as claimed in claim 1, characterized in that, using an optical axis of the apparatus as the Z-axis, both for wobbler adjustments in an X-direction and for adjustments in a Y-direction image displacements are determined relative to a central exposure beam device adjustment which is identical for both directions.

3. A method as claimed in claim 1 or 2, characterized in that a wobbler adjusting frequency of between approximately 1 and 500 Hz is used.

4. A method as claimed in any of the claims 1 or 2, characterized in that a single detector for image displacement measurements is used.

5. A method as claimed in any of the claims 1 or 2, characterized in that a place-sensitive linear detector array is used.

6. A method as claimed in any of the claims 1 or 2, characterized in that a scanning detection system is used having a television circuit between the detection system and the central control device.

7. A method as claimed in any of the claims 1 or 2, characterized in that a matrix of self-scanning CCD elements is used.

8. A method as claimed in any of the claims 1 or 2, characterized in that the beam displacements are adapted to optimum detection by controlling the energization of the objective lens.

9. A method as claimed in any of the claims 1 or 2, characterized in that in a STEM-mode adjustment of an apparatus using a beam of charged particles a beam deflection signal depending on the objective lens energization is applied to a beam deflection device.

10. A method as claimed in claim 9, characterized in that for switching between a TEM mode and the STEM mode the objective lens is equipped with a switchable auxiliary lens and the central control device controlled by a switching signal applies the beam deflection signals to the beam deflection device suitable for that purpose.

11. A method as claimed in any of the claims 1 or 2, characterized in that in a TEM-mode adjustment of an apparatus using charged particles, a beam deflection signal depending on the objective energization is applied to a picture deflection device.

12. A method as claimed in claim 11, characterized in that for switching between the TEM mode and a STEM mode the objective lens is equipped with a switchable auxiliary lens and the central control device controlled by a switching signal applies the beam deflection signals to the beam deflection device suitable for that purpose.

13. An apparatus for using beam of charged particles comprising:
   a source of charged particles,
   a system of lenses,
   a wobbler,
   an objective lens system,
   a central control device,
   first means for determining image displacements for two different wobbler adjustments with respect to an image located between said displaced images and corresponding to a third wobbler adjustment, and second means for readjusting the beam to make said different image displacements equal.

* * * * *